United States Patent
Barratt

(12) 
(10) Patent No.: US 6,872,962 B1
(45) Date of Patent: Mar. 29, 2005

(54) RADIO FREQUENCY (RF) FILTER WITHIN MULTILAYERED LOW TEMPERATURE CO-FIRED CERAMIC (LTCC) SUBSTRATE

(75) Inventor: Christopher Barratt, Valbonne (FR)

(73) Assignee: National Semiconductor Corporation, Santa Clara, CA (US)

( * ) Notice: Subject to any disclaimer, the term of this patent is extended or adjusted under 35 U.S.C. 154(b) by 20 days.

(21) Appl. No.: 10/675,547

(22) Filed: Sep. 30, 2003

(51) Int. Cl.⁷ ............................................. H01L 29/00
(52) U.S. Cl. ........................................................ 257/1
(58) Field of Search ................................ 257/275, 277, 257/700, 703, 415, 724

(56) References Cited

U.S. PATENT DOCUMENTS

| | | |
|---|---|---|
| 4,075,509 A | 2/1978 | Redfern |
| 5,144,526 A | 9/1992 | Vu et al. |
| 5,428,245 A | 6/1995 | Lin et al. |
| 5,504,370 A | 4/1996 | Lin et al. |
| 5,508,881 A | 4/1996 | Stevens |
| 5,596,225 A | 1/1997 | Mathew et al. |
| 5,670,824 A | 9/1997 | Weinberg |
| 5,741,721 A | 4/1998 | Stevens |
| 5,977,915 A | 11/1999 | Bergstedt et al. |
| 6,055,151 A | 4/2000 | Tormey et al. |
| 6,198,374 B1 | 3/2001 | Abel |
| 6,198,635 B1 | 3/2001 | Shenoy et al. |
| 6,223,329 B1 | 4/2001 | Ling et al. |
| 6,228,788 B1 | 5/2001 | Jean et al. |
| 6,252,761 B1 | 6/2001 | Branchevsky |
| 6,348,844 B1 | 2/2002 | Albinsson et al. |
| 6,351,880 B1 | 3/2002 | Palmer et al. |
| 6,399,230 B1 | 6/2002 | Tormey et al. |
| 6,417,744 B1 | 7/2002 | Albinsson et al. |
| 6,456,172 B1 | 9/2002 | Ishizaki et al. |
| 6,477,054 B1 | 11/2002 | Hagerup |
| 6,501,181 B2 | 12/2002 | Albinsson |
| 6,532,143 B2 | 3/2003 | Figueroa et al. |
| 6,534,855 B1 | 3/2003 | Ahn et al. |
| 6,815,739 B2 * | 11/2004 | Huff et al. .................. 257/275 |

* cited by examiner

Primary Examiner—Roy Potter
(74) Attorney, Agent, or Firm—Vedder Price Kaufman & Kammholz, P.C.

(57) ABSTRACT

A multilayered, low temperature co-fired ceramic (LTCC) substrate within which a radio frequency (RF) filter is formed. Portions of a bandpass filter are implemented using electrode patterns on different ceramic tape layers of which selected portions maintain a symmetrical physical filter structure, thereby providing self-compensation for changes in mutual coupling (e.g., mutual inductance) caused by small errors in alignment of the ceramic tape layers occurring during manufacturing.

19 Claims, 15 Drawing Sheets

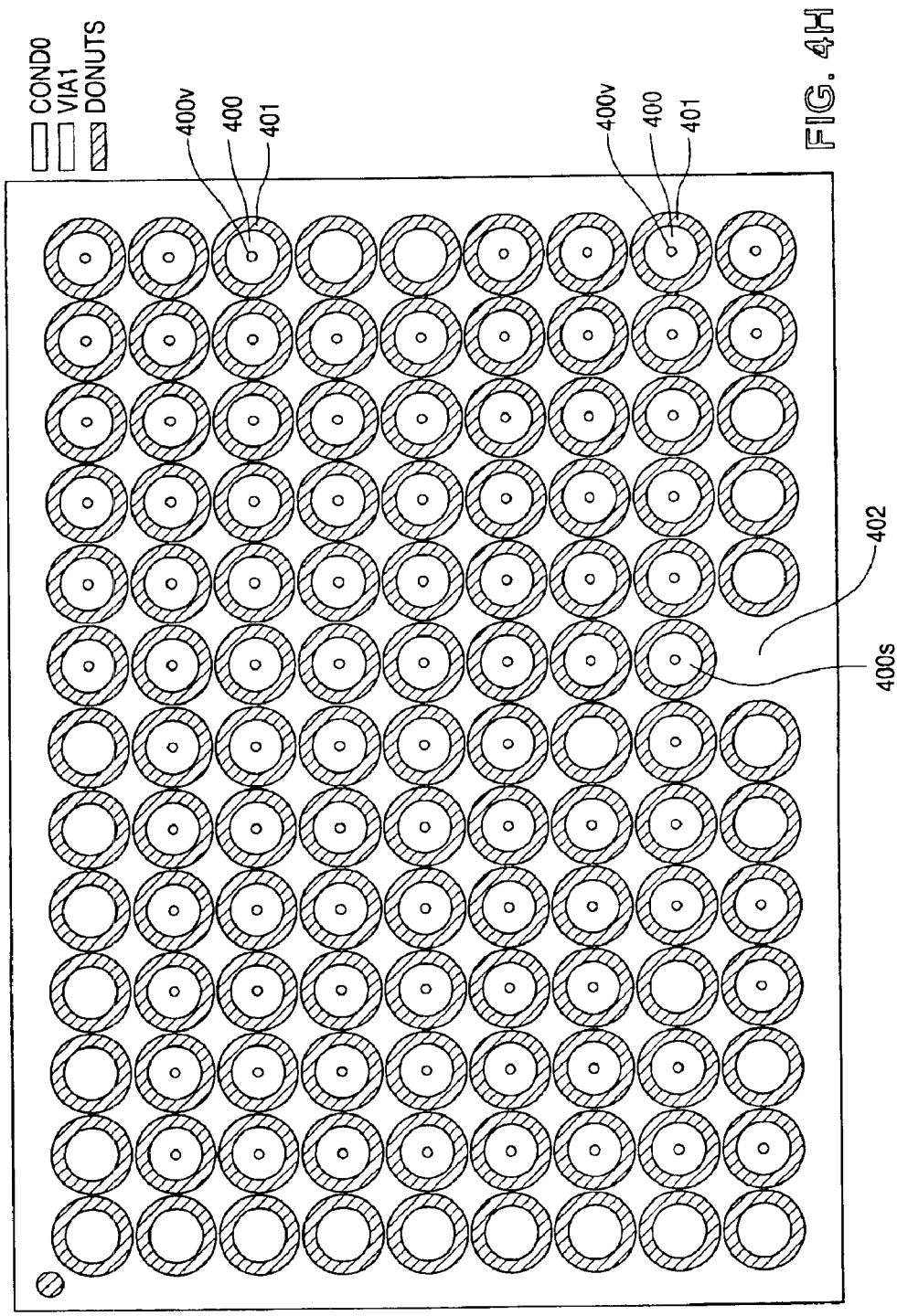

RADIO FREQUENCY (RF) FILTER WITHIN MULTILAYERED LOW TEMPERATURE CO-FIRED CERAMIC (LTCC) SUBSTRATE

BACKGROUND OF THE INVENTION

1. Field of the Invention

The present invention relates to radio frequency (RF) circuits implemented with multilayered low temperature co-fired ceramic (LTCC) substrates, and in particular, to RF filter circuits within LTCC substrates.

2. Description of the Related Art

As electronic circuitry has become increasingly sophisticated, many forms of device and circuit scaling have been used to reduce the size and space needed, as well as to provide durability. First, individual devices and other circuit components were mounted on printed circuit boards. As integrated circuits (ICs) became more developed, more devices and components became integrated, thereby allowing the printed circuit boards and other substrates to be further reduced in size. More recently, ICs have developed to the point where virtually entire systems are integrated within one die, or chip. However, one exception to this has been many forms of RF circuits due to the need for various capacitors and inductors which are difficult, if not impossible, to fully integrate within a chip. Accordingly, alternative techniques have been developed to miniaturize and provide durable circuits and subsystems. One technique has been the use of "hybrid" circuits in which ICs are mounted along with other forms of chip components, including chip resistors, inductors and capacitors, on some form of substrate (e.g., alumina ceramic) and then hermetically sealed for protection. Another technique which is seeing increased use is the use of multilayered LTCC substrates on which ICs and other chip components are mounted on the top surface, while passive components, such as inductors and capacitors, are formed among the underlying layers.

As is well known, a typical implementation of circuitry using an LTCC substrate includes multiple layers of a ceramic "tape" which are used to provide the base structure, i.e., substrate, within and upon which to form various electronic components and electrical connections. This tape is formed from a powdered ceramic material which is then mixed with a binder material. For example, one commonly used ceramic tape is that available from DuPont under the trade name "Green Tape 951". Electronic components that can be formed within or among the various LTCC layers include resistors, capacitors and inductors. The electrical connections between each tape layer, similar to those connections formed within various layers within an integrated circuit, are known as "vias" and are formed by apertures lined or filled with a conductive material.

As is further well known, such components are formed by establishing (e.g., punching) holes in the tape as appropriate and layering metal, dielectric material and insulating material. Several layers of the tape are generally used to form the ultimate desired circuitry. These tape players are then pressed together and fired in an oven to remove the binder and sinter the ceramic powder. Components which are too large or difficult to include or form within or among the ceramic tape layers, e.g., IC chips, are typically surface-mounted on the top of the hardened substrate. The resulting substrate and components, often less than one inch square, provide a compact and durable packaged circuit.

Referring to FIG. 1, for example, integrated LTCC modules are frequently used in cellular wireless telephones. As discussed above, each of the multiple layers of ceramic material is printed with metallized circuit patterns that are electrically coupled layer-to-layer by conductive vias (small metallized holes which pass vertically through the ceramic material layers). The individual layers are then assembled, laminated under pressure and co-fired (fired as a unit) to create a monolithic structure. The external contacts may be plated with gold, nickel or tin to protect conductive metal and to facilitate interconnection at the next system level. The end result is a mechanically strong, hermetic, thermally conductive, chemically inert and dimensionally stable ceramic structure.

With respect to hermeticity, the internal conductors are protected by the surrounding dense ceramic material. Metal components, such as sealing rings, are brazed to the plated surface of the co-fired ceramic to provide protection of the surface-mounted IC dice. Having the electrical conductors buried within the ceramic structure reduces risks of short circuits due to environmental effects, such as moisture, dirt or other factors.

Circuit density is directly proportional to the number of layers. Increased density of the circuitry to be implemented may require the addition of layers to prevent undesirable electrical performance characteristics, such as crosstalk or other forms of electrical signal interference. Further, distributing circuitry on additional layers can help to avoid yield losses caused by very fine signal lines and spacings.

Some problems which can arise from such dense packaging, notwithstanding the use of additional layers, can be noise or signal-induced interference caused by close proximities of the various signal and power supply lines and changes in circuit performances due to the slight variations in alignment or registration between the various ceramic layers that can be expected within normal manufacturing tolerances. These issues, among others, are addressed by the presently claimed invention.

SUMMARY OF THE INVENTION

In accordance with the presently claimed invention, a multilayered, low temperature co-fired ceramic (LTCC) substrate is provided within which a radio frequency (RF) filter is formed. Portions of a bandpass filter are implemented using electrode patterns on different ceramic tape layers of which selected portions maintain a symmetrical physical filter structure, thereby providing self-compensation for changes in mutual coupling (e.g., mutual inductance) caused by small errors in alignment of the ceramic tape layers occurring during manufacturing.

In accordance with one embodiment of the presently claimed invention, a radio frequency (RF) filter within a multilayered low temperature co-fired ceramic (LTCC) substrate includes multiple ceramic tape layers with respective electrode patterns, and a plurality of conductive vias. A first ceramic tape layer with a first electrode pattern forms a first RF ground plane. A second ceramic tape layer with a second electrode pattern forms a second RF ground plane. A third ceramic tape layer positioned between the first and second ceramic tape layers with a third electrode pattern includes a first sub-pattern forming a portion of a first shunt reactance including a first inductance, and a second sub-pattern forming a first portion of a second shunt reactance including a first portion of a second inductance. A fourth ceramic tape layer positioned between the first and second ceramic tape layers with a fourth electrode pattern includes a third sub-pattern forming a portion of a third shunt reactance including a third inductance, and a fourth sub-pattern forming a second portion of the second shunt reactance including a second portion of the second inductance. The plurality of conductive vias couple selected respective portions of the first, second, third and fourth electrode patterns. The third and fourth electrode patterns together form at least a portion of a multiple-pole RF bandpass filter circuit with the second shunt reactance coupled intermediately to the first and third shunt reactance portions, and corresponding portions of the first and third sub-patterns are mutually superimposed.

In accordance with another embodiment of the presently claimed invention, a radio frequency (RF) filter within a multilayered low temperature co-fired ceramic (LTCC) substrate includes multiple ceramic tape layers with respective electrode patterns, and a plurality of conductive vias. A first ceramic tape layer with a first electrode pattern forms a first RF ground plane. A second ceramic tape layer with a second electrode pattern forms a second RF ground plane. A third ceramic tape layer positioned between the first and second ceramic tape layers with a third electrode pattern includes a first sub-pattern forming a portion of a first shunt reactance including a first inductance, and a second sub-pattern forming a first portion of a second shunt reactance including a first portion of a second inductance. A fourth ceramic tape layer positioned between the first and second ceramic tape layers with a fourth electrode pattern includes a third sub-pattern forming a portion of a third shunt reactance including a third inductance, and a fourth sub-pattern forming a second portion of the second shunt reactance including a second portion of the second inductance. The plurality of conductive vias couple selected respective portions of the first, second, third and fourth electrode patterns. The third and fourth electrode patterns together form at least a portion of a multiple-pole RF bandpass filter circuit with the second shunt reactance coupled intermediately to the first and third shunt reactance portions, and the second and fourth sub-patterns together form an approximately symmetrical portion of a periphery at least partially enclosing the first and third sub-patterns.

BRIEF DESCRIPTION OF THE DRAWINGS

FIGS. 4A–4H illustrate the eight conductive electrode patterns of the seven layers of an LTCC substrate used to implement the circuit of FIGS. 2A–2D.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators.

Referring to FIGS. 2A–2D together, an RF circuit module with an LTCC substrate in accordance with one embodiment of the presently claimed invention includes two surface-mounted IC chips, IC1, 1C2 and a number of various surface-mounted or buried passive support components, i.e., resistors, capacitors and inductors, interconnected substantially as shown, and interfaced with external circuitry by way of an array IO1 of input/output connections. The specific functions and operations performed by the integrated circuits IC1, IC2 will not be described as they are not material to the subject invention. Selected ones of the outlying passive components which are material to the subject invention are discussed in more detail below.

Figure 1:
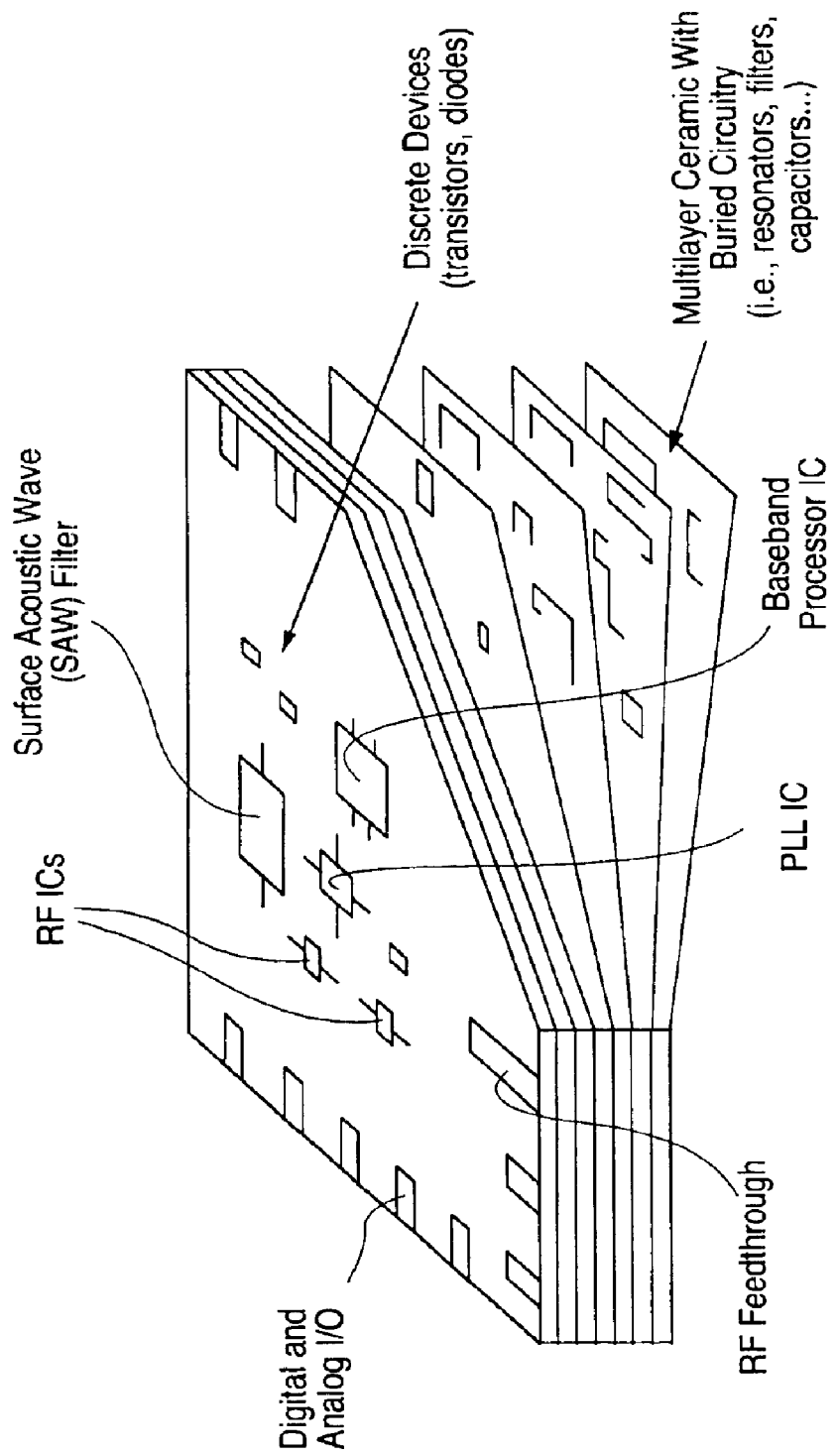
FIG. 1 is a perspective, cross-sectional view of a conventional RF circuit module with an LTCC substrate.
Figure 2A:
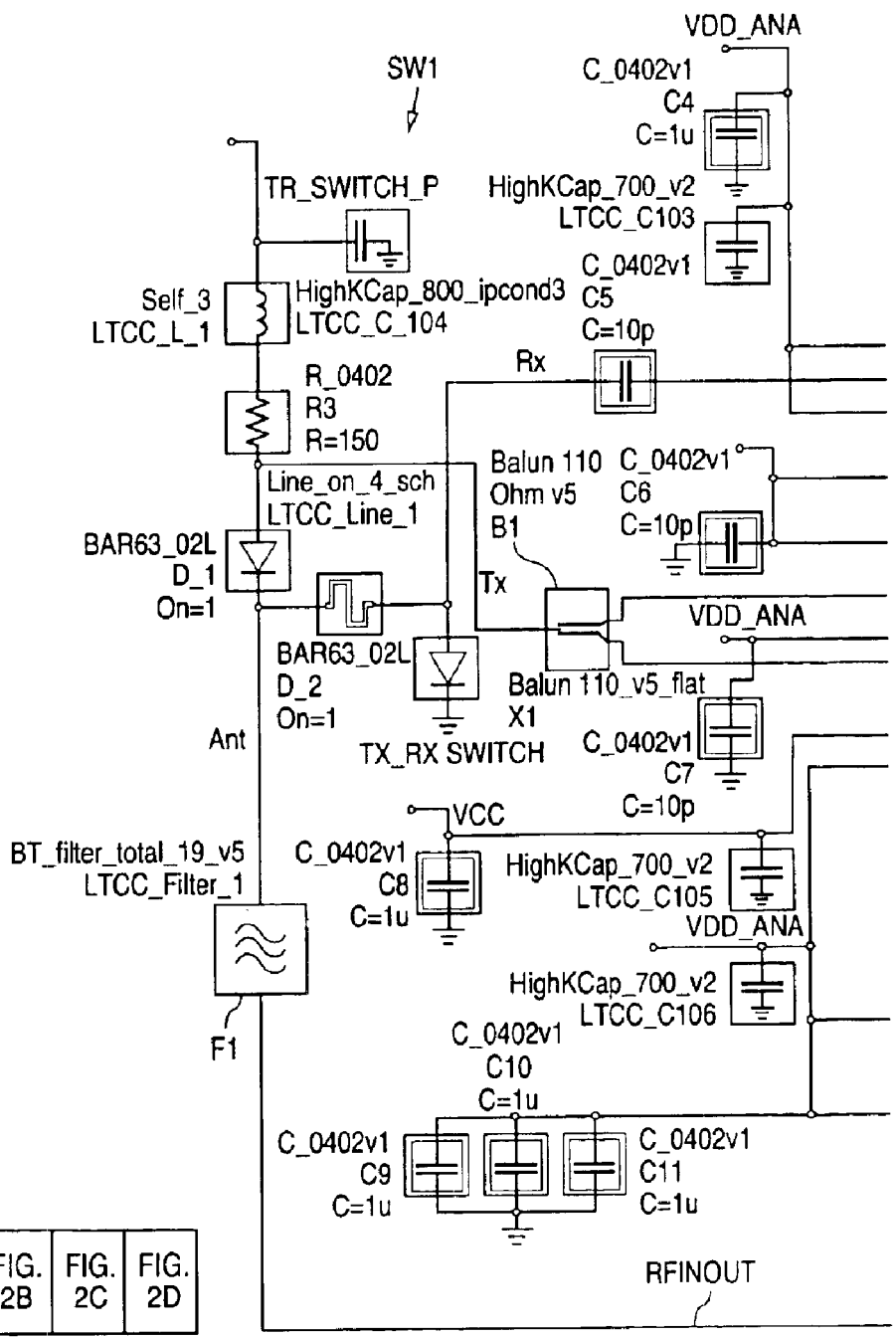
FIGS. 2A, 2B, 2C and 2D together are a circuit schematic diagram of an RF module with an LTCC substrate in accordance with one embodiment of the presently claimed invention.
Figure 2B:
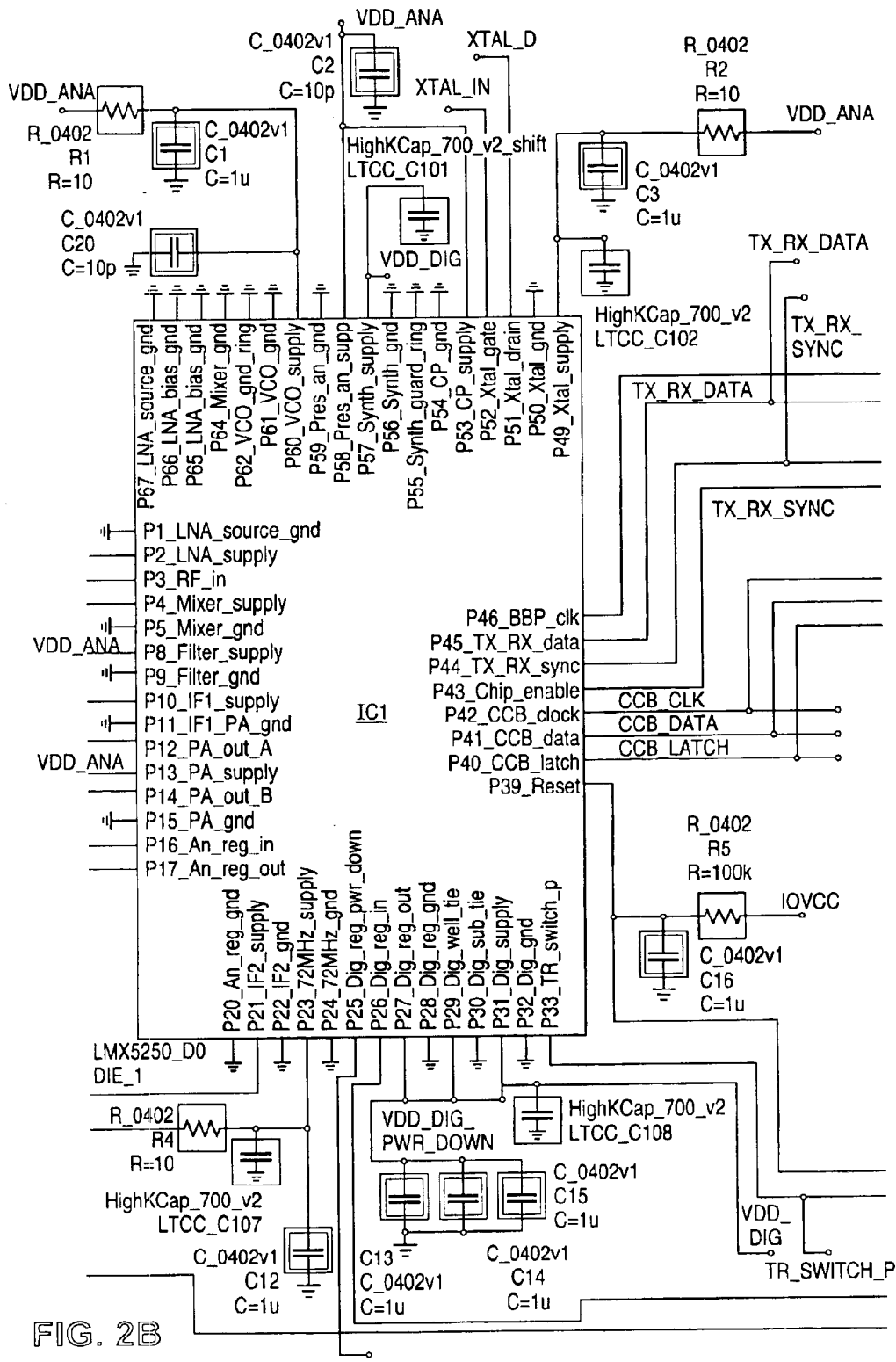
Figure 2C:
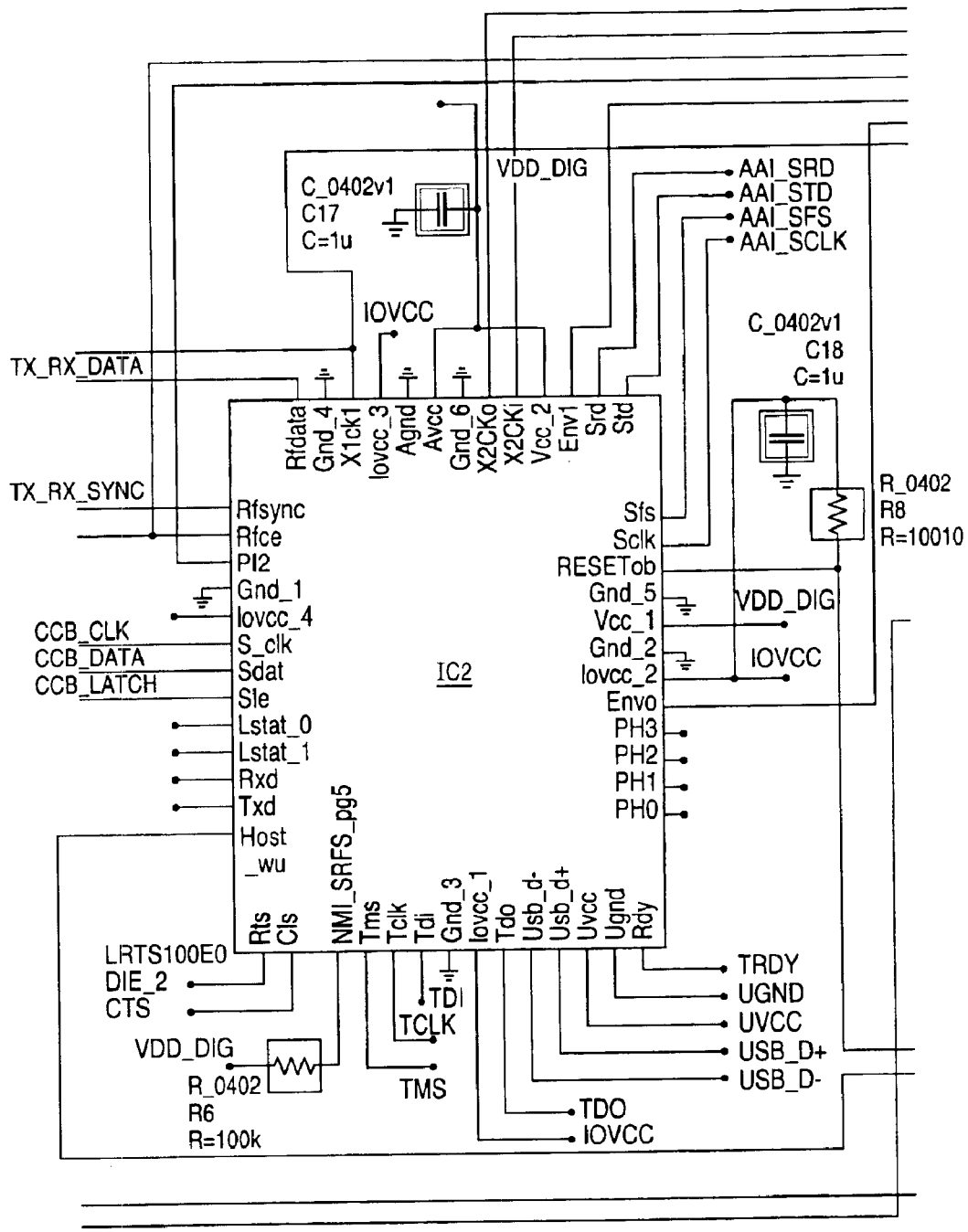
Figure 2D:
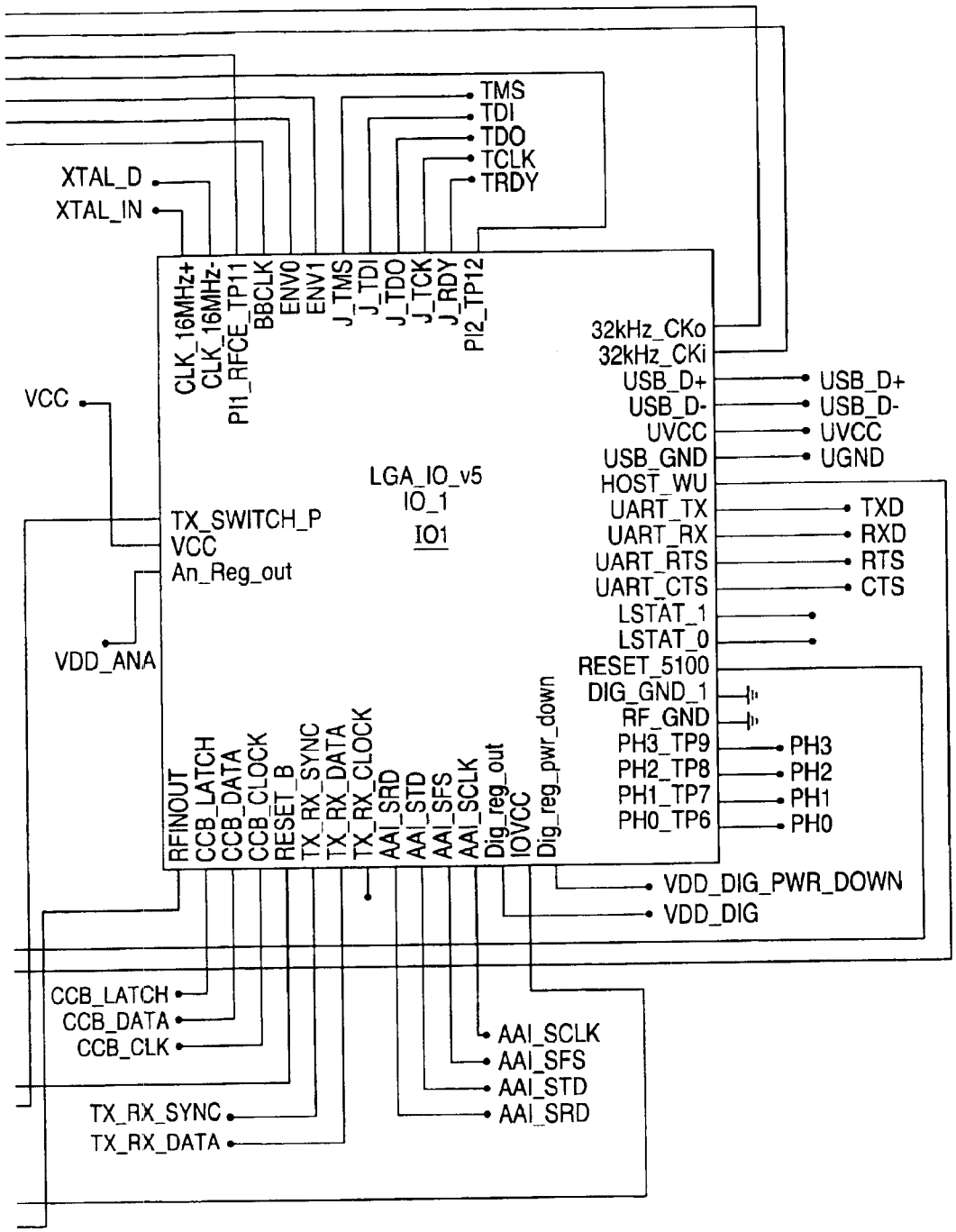

Referring to FIG. 2A, the incoming and outgoing RF signal is conveyed via signal line RFINOUT and passes through a multiple pole bandpass filter F1 and an RF switch SW1. The incoming RF signal passes through the switch SW1 and is provided to the RF input port of the integrated circuit IC1 via a coupling capacitor C5. The outgoing RF signal is provided by the integrated circuit IC1 as a balanced signal which passes through a balanced-unbalanced transformer ("balun") B1 for conveyance to the output through the switch SW1 and filter F1.

In accordance with well known distributed-circuit RF switch techniques, the RF switch SW1 uses diodes D1, D2 and a quarter-wavelength transmission line LINE_1 to provide the appropriate input and output signal paths.

Bypass capacitors C101, C102, C103, C105, C106, C107 and C108 provide decoupling for their respective power supply connections, while bypass capacitor C104 provides decoupling for the DC signal used to control the RF switch SW1.

Figure 3:
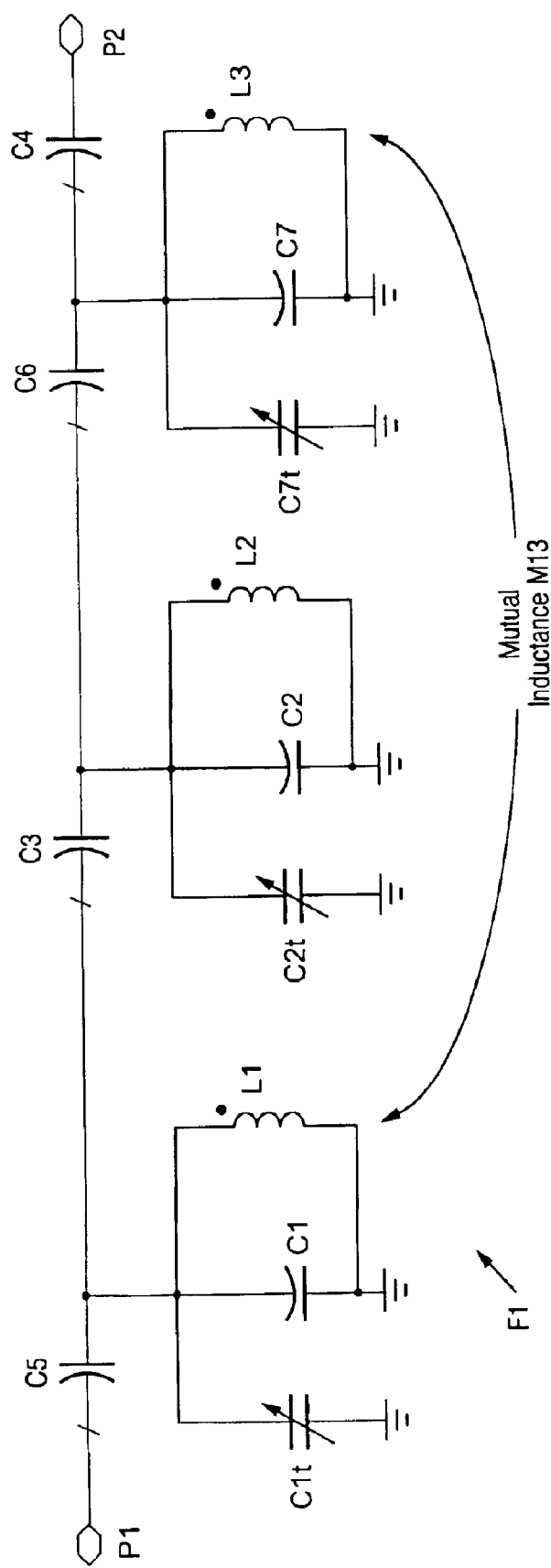
FIG. 3 is a circuit schematic diagram of a multiple pole bandpass filter used in the circuit of FIGS. 2A, 2B, 2C and 2D.

Referring to FIG. 3, filter F1 is designed according to conventional bandpass filter design techniques, and includes serially coupled capacitors C3, C4, C5, C6, shunt inductors L1, L2, L3, and shunt capacitors C1, C1$t$, C2, C2$t$, C7, C7$t$, all interconnected substantially as shown. Capacitors C1$t$, C2$t$ and C7$t$ are tunable capacitors which are tuned, or trimmed, during manufacture of the RF module. As discussed in more detail below, shunt inductors L1 and L3 are in such mutual proximity as to form a mutual inductance M13 which, in accordance with conventional filter theory and design, is a factor in establishing the frequency filtering characteristics of the filter F1, providing additional rejection at frequencies just below the passband due to an additional left side "zero" the transfer function of the filter F1.

As will be discussed in more detail below, these capacitors and inductors forming the filter F1 are themselves formed using various electrode patterns on multiple layers of the underlying LTCC substrate. For example, portions of series capacitors C3 and C6 are on layers 3 and 4, while portions of series capacitors C4 and C5 are on layers 2, 3 and 4. Portions of shunt capacitors C1, C2 and C7 are on layers 1 and 2. Tunable capacitors C1t, C2t and C7t use layers 6 and 7. Shunt inductors L1 and L3 use layers 3 and 4, respectively, while shunt inductor L2 uses layers 3 and 4.

Referring to FIGS. 4A–4H, the seven layers of ceramic material forming the LTCC substrate for the circuit of FIGS. 2A–2D use various electrode patterns to form the bandpass filter F1, balun B1 and bypass capacitors C101–C108. As indicated in FIGS. 4A–4H, the eight electrode patterns are identified as conductor 7, 6, 5, 4, 3, 2, 1 and 0, respectively. Accordingly, FIGS. 4A, 4B, 4C, 4D, 4E, 4F, 4G and 4H correspond to electrode patterns 7, 6, 5, 4, 3, 2, 1 and 0, respectively, with electrode patterns 1 and 0 being on the top and bottom, respectively, of the first layer of ceramic material.

Figure 4A:
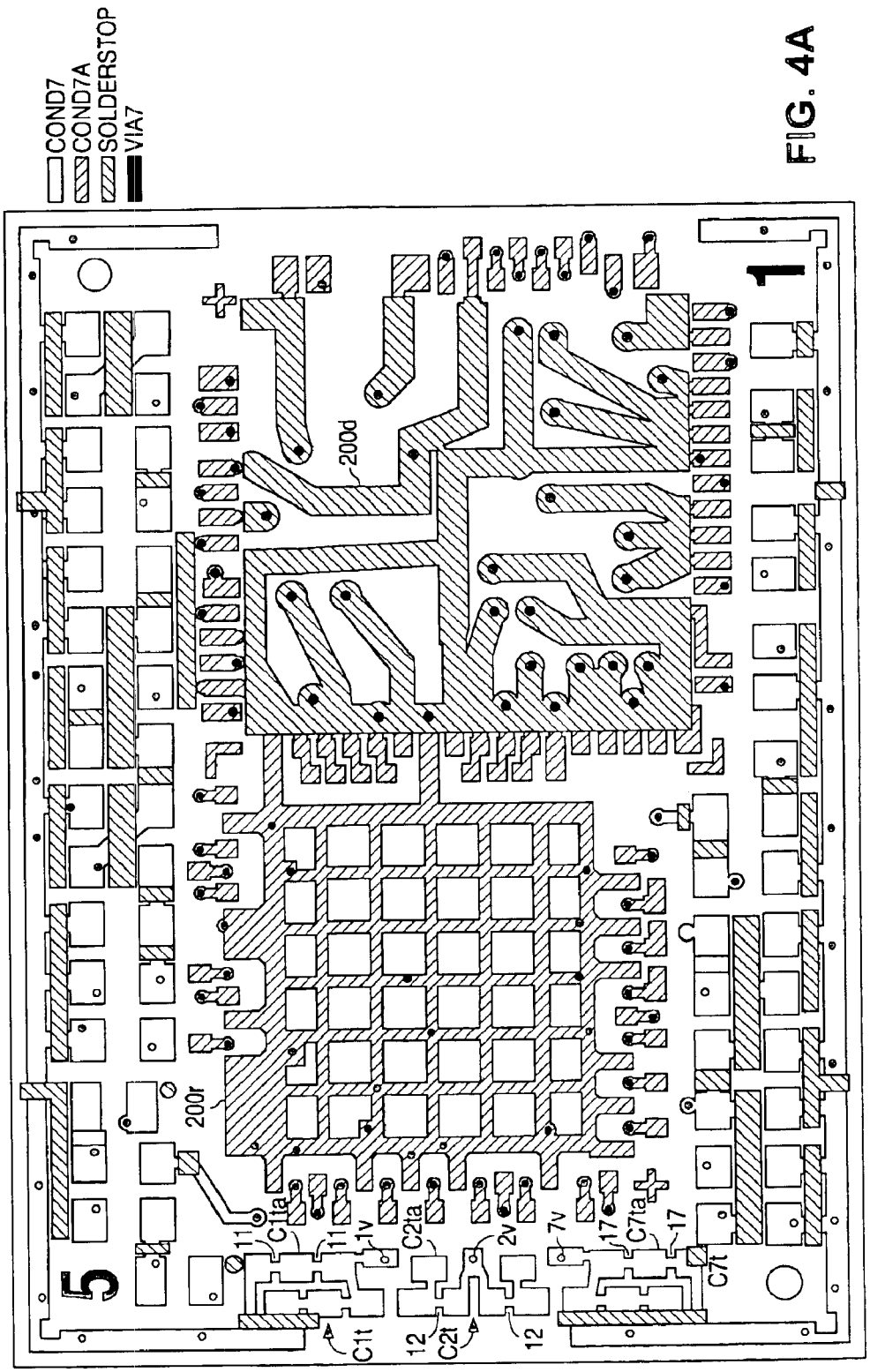

Referring to FIG. 4A, electrode pattern 7 includes conductor area 200r which forms an RF ground region. Conductor C1ta forms a series of upper plates for tunable capacitor C1t, separated by conductor bridges 11 which can be trimmed by a laser so as to provide the appropriate upper plate area to achieve the desired capacitance for capacitor C1t. Similarly, conductor regions C2ta and C7ta provide the upper capacitor plate regions for tunable capacitors C2t and C7t, with conductive bridges 12, 17 for laser trimming. These capacitor plate regions C1ta, C2ta, C7ta are connected by respective conductive vias, 1v, 2v, 7v to conductors on layers below so as to place these tunable capacitors C1t, C2t, C7t in parallel with their respective shunt capacitors C1, C2, C7 (FIG. 3).

Figure 4B:
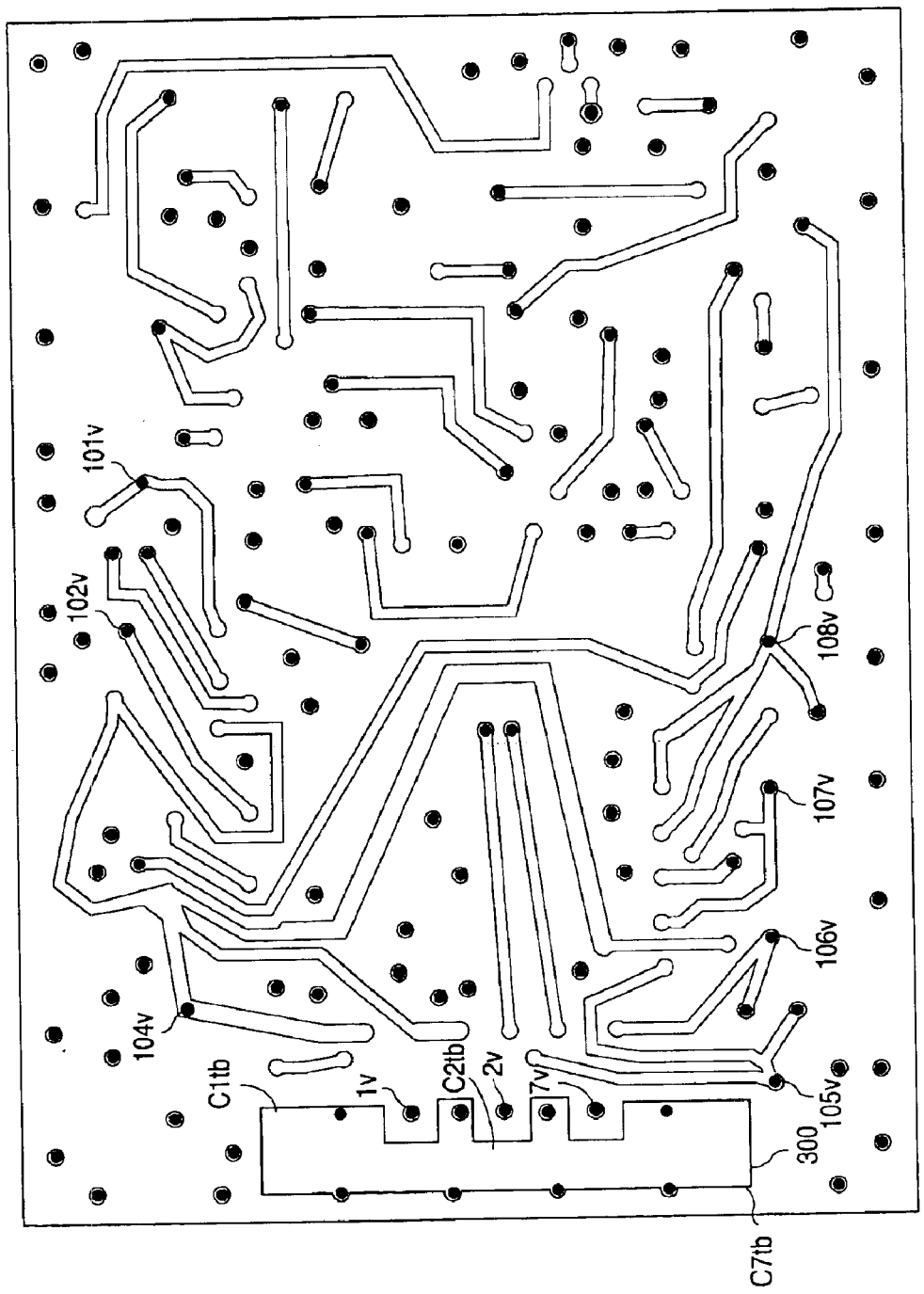

Referring to FIG. 4B, conductor region 300 of electrode pattern 6 provides the lower capacitor plate regions C1tb, C2tb, C7tb for the tunable capacitors C1t, C2t, C7t. The remaining conductive traces or lines of electrode pattern 6 primarily provide for various power supply and signal connections.

Figure 4C:
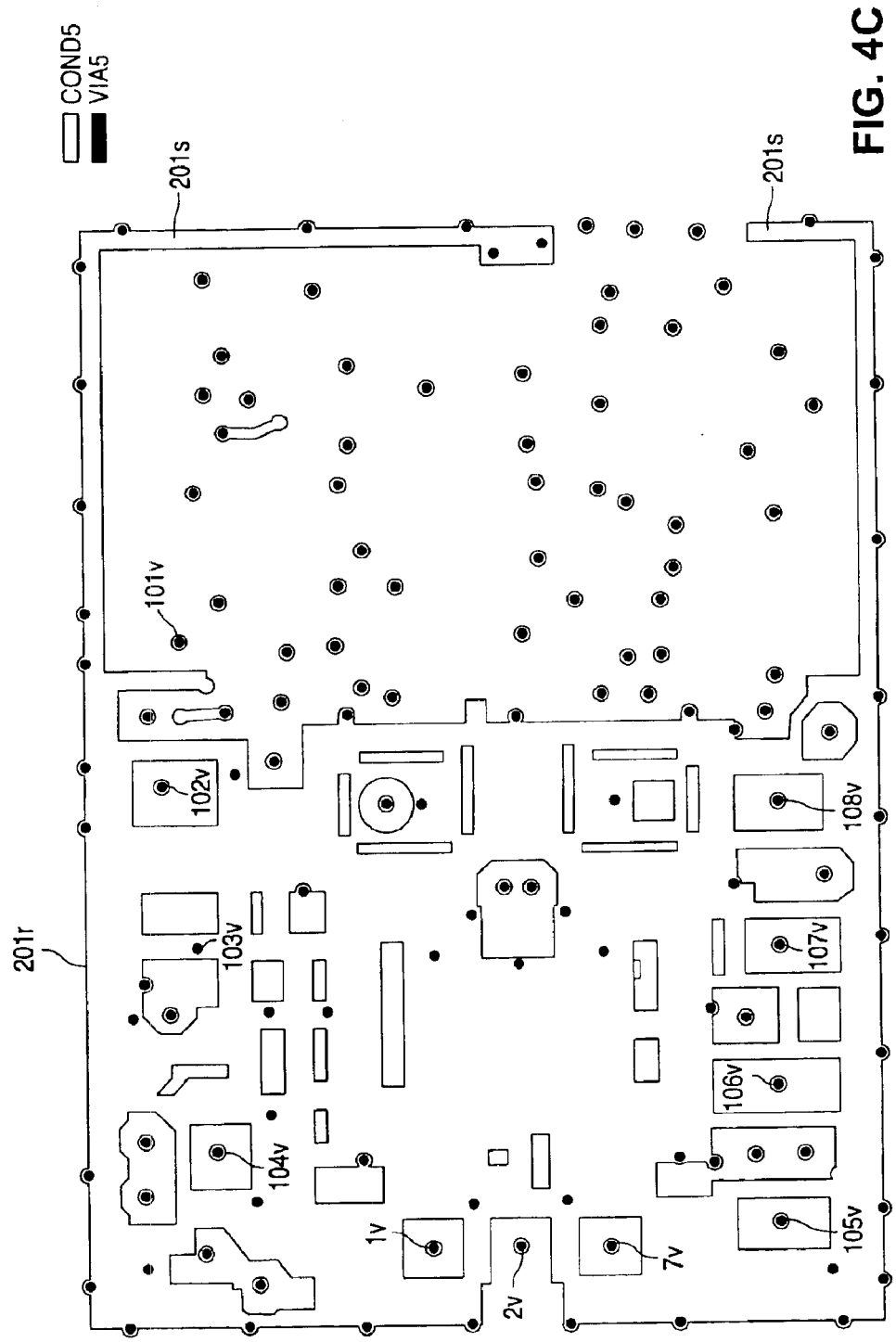

Referring to FIG. 4C, conductor region 201r of electrode pattern 5 provides an RF ground region which also serves as a grounded plate for shunt filter capacitors C1, C2 and C7. Conductor regions 201s provide RF shielding for signals passing through the conductive vias within the bounded interior.

Figure 4D:
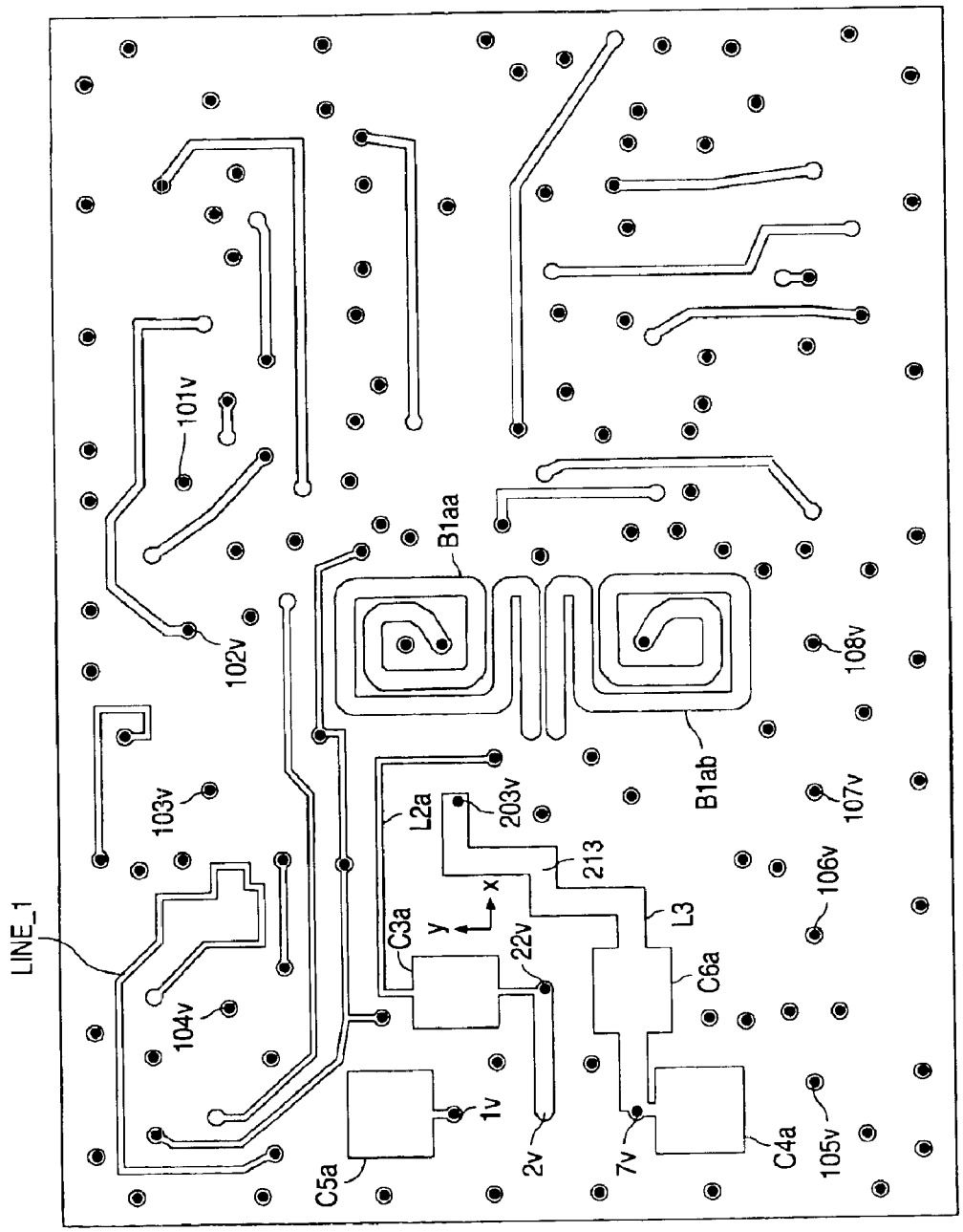

Referring to FIG. 4D, electrode pattern 4 includes conductive traces forming the quarter wavelength (i.e., based upon the wavelength of the nominal (e.g., center) frequency of the bandpass filter F1) transmission line LINE_1 separating the diodes D1, D2 in the RF switch SW1 (FIG. 2A), and portions B1aa, B1ab of the balun B1. Additionally, several portions of the bandpass filter components C3, C4, C5, C6, L2, L3 are provided, including lump-circuit capacitor plates C3a, C4a, C5a and C6a for capacitors C3, C4, C5 and C6, respectively, plus a conductor trace L2a forming a lumped-circuit portion of inductor L2. Further, a conductive trace L3 is provided forming a lumped-circuit implementation of shunt inductor L3.

Figure 4E:
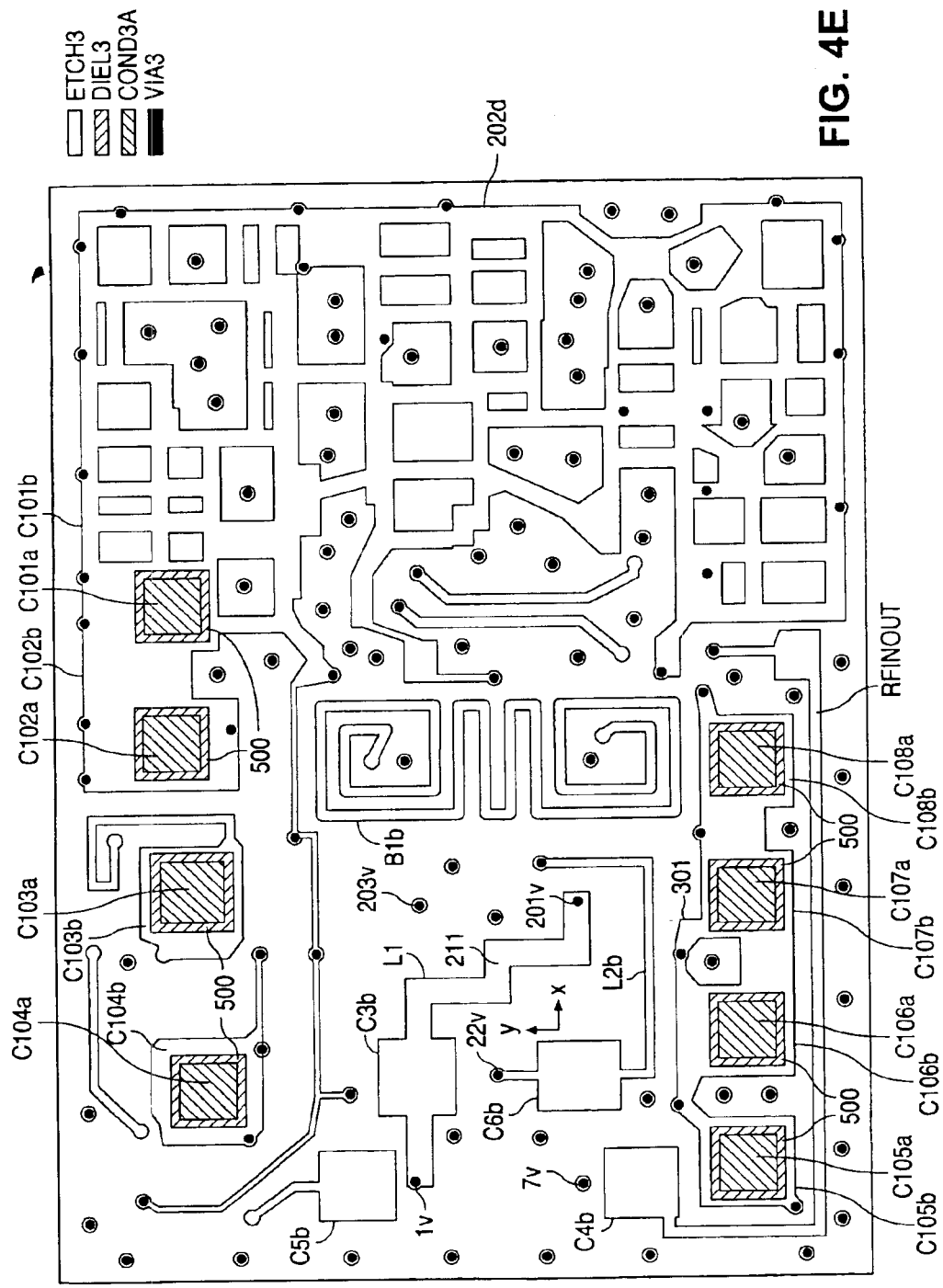

Referring to FIG. 4E, conductor region 202d of electrode pattern 3 provides a digital ground region, plus lower capacitor plates C101b, C102b for bypass capacitors C101 and C102 (discussed in more detail below). Additional conductive traces C103b and C104b provide lower capacitor plates for bypass capacitors C103 and C104 (discussed in more detail below). Another conductor region 301 provides lower capacitor plate regions C105b, C106b, C107b and C108b for bypass capacitors C105, C106, C107 and C108 (discussed in more detail below). Another conductive trace B1b provides the remainder of the balun B1 with electromagnetic coupling occurring with the conductor regions B1aa, B1ab on electrode pattern 4 through the dielectric formed by the ceramic tape layer 4.

Still further conductive regions provide additional capacitor plate regions C3b, C4b, C5b and C6b for filter capacitors C3, C4, C5 and C6, respectively. Another conductive trace L2b provides another portion of the shunt inductor L2 of the filter F1, while another conductive trace L1 forms a lumped-circuit implementation of shunt inductor L1 for the filter F1 (FIG. 3).

It will be understood by one of ordinary skill in the art that inductors L3 and L1 are implemented on electrode patterns 4 and 3 (FIGS. 4D and 4E) in accordance with well known RF circuit design techniques for transmission lines with the appropriate characteristic impedance at the nominal frequency of the signal(s) of interest. With reference to the circuit schematic of FIG. 3, inductors L3 and L1 are connected between capacitor plates of series capacitors C6 and C3, respectively, and RF circuit ground potential. The connections to the RF circuit ground regions are provided by conductive vias 203v and 201v, respectively, to an RF ground region 203r on electrode pattern 1. As will also be understood, by grounding one end of these conductive traces L3, L1, and making the physical line lengths of these traces L3, L1 the appropriate fraction of the wavelength of the nominal frequency of the signal of interest, a net shunt inductance appears at capacitor plates C6a and C3b.

Figure 4F:
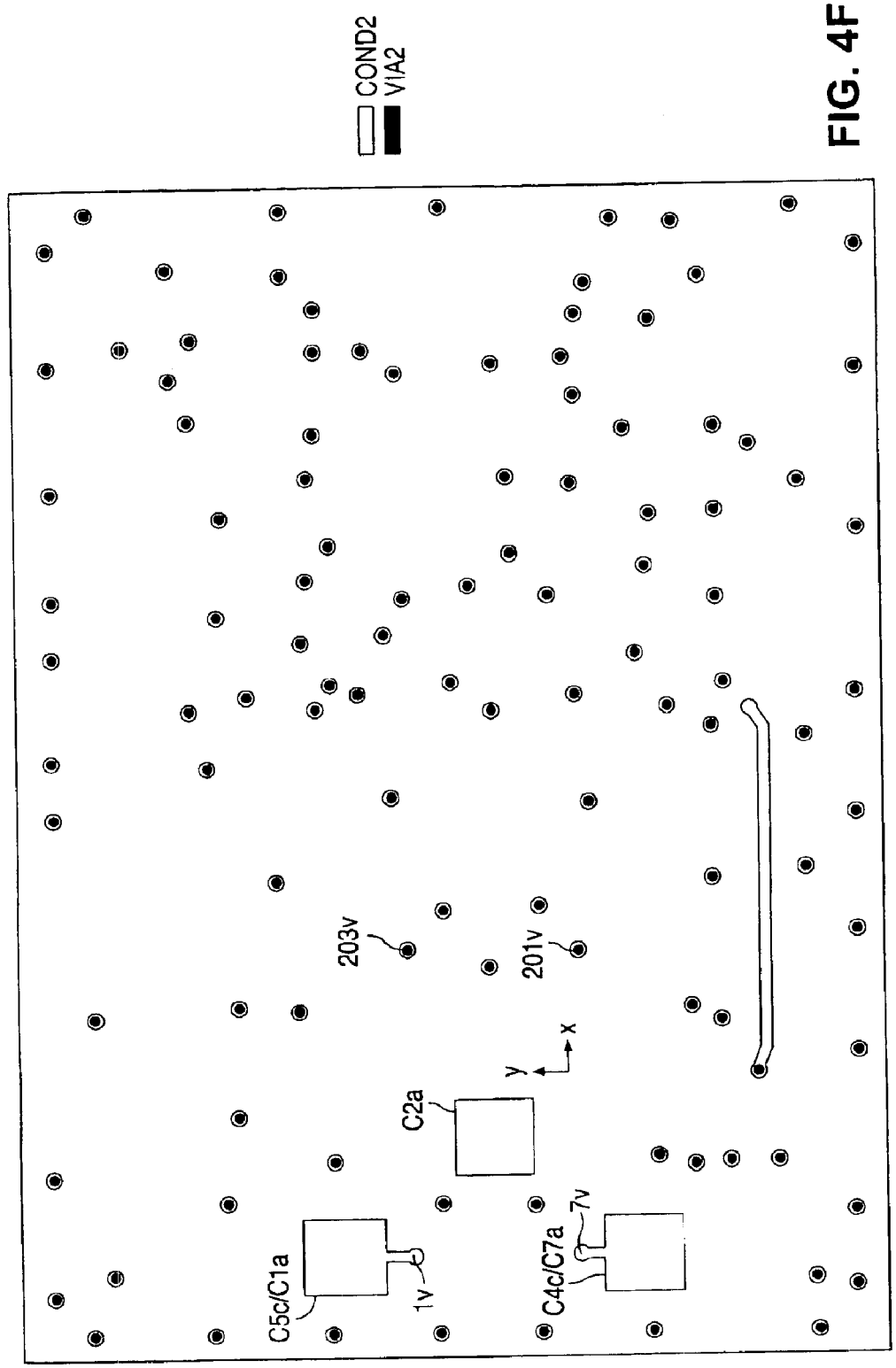

Referring to FIG. 4F, electrode pattern 2 includes numerous conductive vias, plus three capacitor plates, or electrodes, C2a, C5c/C1a, C4c/C7a. Capacitor plate C2a is for the remaining shunt filter capacitor C2 of the filter F1. Capacitor plate C5c/C1a is a shared capacitor plate for serial coupling capacitor C5 and shunt capacitor C1. By virtue of ceramic tape layer 3 between electrode patterns 2 and 3, this plate C5c/C1a forms part of the capacitance of serial capacitor C5. Additionally, this plate C5c/C1a forms one of two capacitor plates for shunt capacitor C1. Similarly, capacitor plate C4c/C7a is a shared capacitor plate for serial coupling capacitor C4 and shunt capacitor C7 of the filter F1.

Figure 4G:
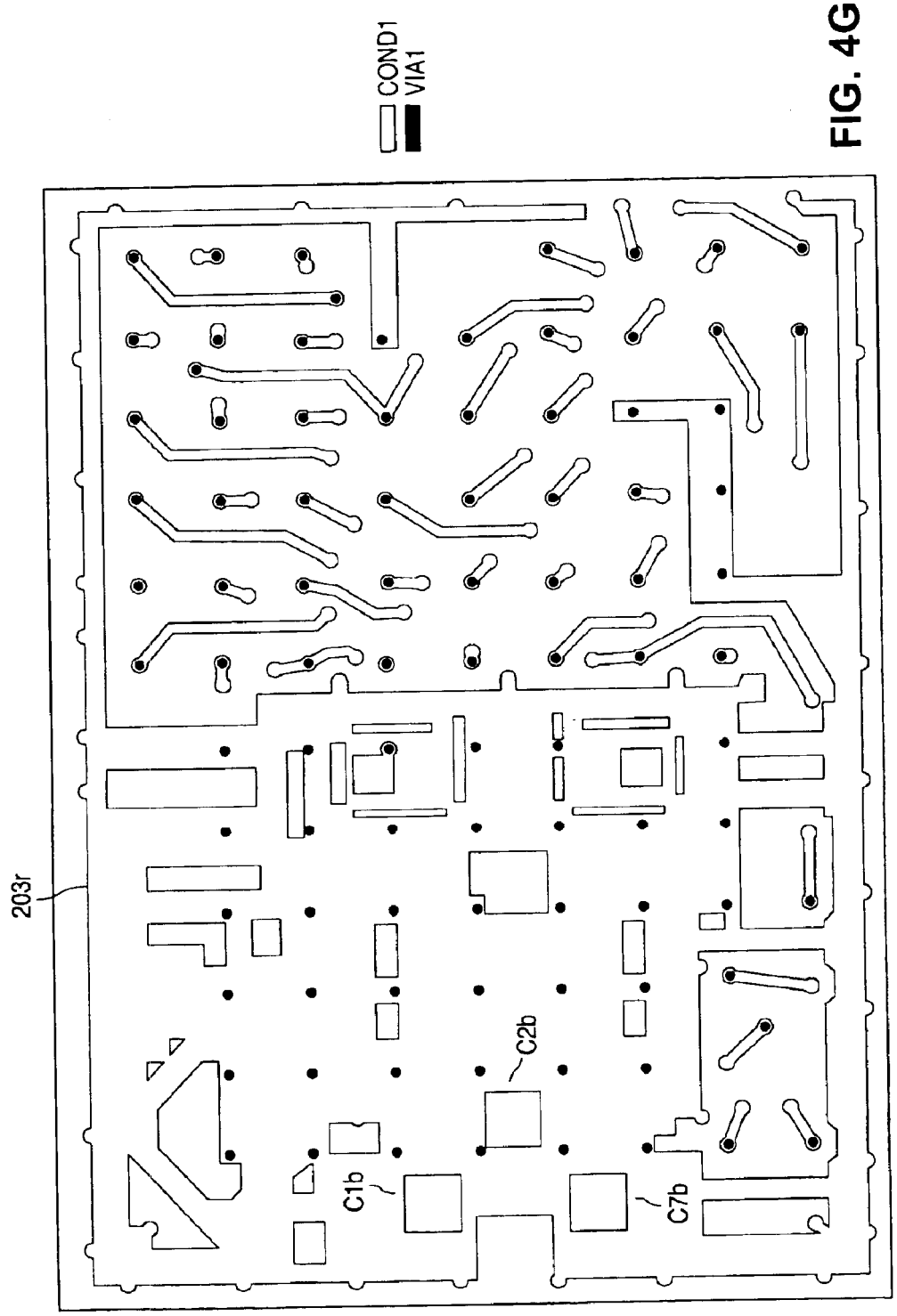

Referring to FIG. 4G, conductor region 203r of electrode pattern 1 provides an RF ground region, which includes capacitor plate regions C1b, C2b and C7b for shunt capacitors C1, C2 and C7, respectively, of the filter F1.

Referring to FIG. 4H, the input/output (I/0) interface for the RF circuit module is achieved in a conventional manner using a ball grid array (BGA) interface in which conductive balls 400 on the reverse side (e.g., bottom) of the layer 1 ceramic material are connected by conductive vias 400v to the circuitry within the RF module and are surrounded by a glass insulating material 401. One of the interior conductors 400s provides the signal path for the incoming and outgoing RF signal RFINOUT. The space 402 separating this conductor 400s from the outside edge of layer 1 is open, i.e., contains no conductive interconnect, so as to provide a clear path to the signal conductor 400s when mounting the RF module on a circuit board.

Referring back to FIGS. 4D (electrode pattern 4), 4E (electrode pattern 3), 4F (electrode pattern 2) and 4G (electrode pattern 1), a number of characteristics and features of the implementation of the bandpass filter circuit F1 will be noted. The two capacitor plates C3a, C3b of capacitor C3 differ in their respective widths and lengths, i.e., along the X and Y axes, as do the capacitor plates C6a, C6b of capacitor C6. Accordingly, for normal variations in alignment, or registration, between electrode patterns 4 and 3 during the manufacturing process, the upper capacitor plates C3a, C6a may shift along the X or Y axes, or both. Accordingly, as a result, while some portion of the upper capacitor plate C3a, C6a may shift away from its normal opposition to its counterpart lower capacitor plate C3b, C6b, such a reduction in capacitor area is added at the other side, thereby resulting in self-compensation for such alignment errors. Similar self-compensation occurs with respect to capacitor C2 in the event that the upper capacitor plate C2a (electrode pattern 2) experiences a nominal amount of shifting in the X or Y direction relative to the lower capacitor plate C2b (electrode pattern 1) formed by the RF ground region 203r.

Figure 5:
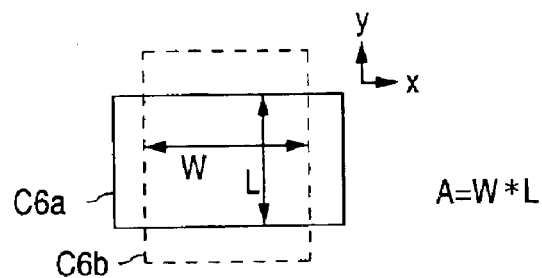
FIG. 5 depicts mutually superimposed rectangular capacitor plates used for the shunt filter capacitors in the LTCC structure of FIGS. 4A–4H.

Referring to FIG. 5, using capacitor C6 as an example, it can be seen that with the use of rectangular capacitor plates C6a, C6b which are mutually superimposed as depicted in FIGS. 4D and 4E, normal variations in alignment along the X or Y directions will be self-compensating in that the width and length dimensions of the superimposed regions of the capacitor plates C6a, C6b will remain substantially constant. Accordingly, the resulting capacitor plate area will remain substantially constant; therefore the capacitance will remain substantially constant.

With respect to shunt filter inductors L1 and L3, it can be seen that the approximately central regions 213, 211 of the traces L3, L1 (FIGS. 4D and 4E) are substantially mutually superimposed, with the remaining geometrically serpentine portions of the conductors L3, L1 extending in generally diametrically opposing directions. This inverse symmetry advantageously provides self-compensation for the mutual inductance M13 formed by these inductors L1, L3 for normal variations in alignment of layers 4 and 3 during the manufacturing process. During any such variations, the major axes (along the Y direction) and minor axes (along the X direction) will remain generally parallel. However, the mutual superimposition of the central regions 213, 211 of these conductors L3, L1 will change slightly. However, while such shifting of this mutual superimposition may affect the mutual inductance M13 due to these superimposed central regions 213, 211, mutual inductance due to the remaining outwardly extending portions of these conductors, L3, L1 will compensate, thereby maintaining a substantially constant mutual inductance M13.

Figure 6:
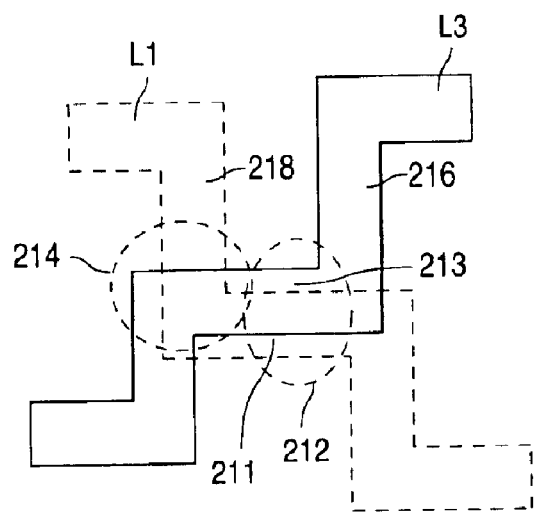
FIG. 6 depicts the partially mutually superimposed conductors used to implement two of the shunt inductances in the filter circuit in the LTCC structure of FIGS. 4A–4H.

Referring to FIG. 6, this self-compensation can be better visualized. While a normal shift in alignment between electrode patterns 4 and 3 along the X and Y directions can result in a reduced mutual superimposition in region 212, an increased mutual superimposition occurs in region 214. Additionally, regions 216 and 218 are now also in closer mutual proximity. Accordingly, overall coupling will remain substantially constant, thereby resulting in substantially constant mutual inductance M13.

Another feature which will be noted is the symmetry of the filter components with respect to the two traces L2a, L2b forming the central shunt inductor L2 and the traces L3, L1 (FIGS. 4D and 4E) responsible for forming the outer shunt inductors L1, L3. In conformance with the discussion above concerning variations in alignment between electrode patterns 4 and 3, normal variations in such alignment along the X and Y directions will be self-compensating with respect to mutual coupling among the shunt inductors L1, L2, L3 due to this symmetry. For example, as noted above, normal shifts in alignment along the X or Y direction will cause conductors L2a and L3 to shift with respect to conductors L2b and L1. However, with the center shunt inductor L2 formed by two generally similar and inversely symmetrical conductors positioned near the periphery of the regions in which the outer shunt inductors L1, L3 are formed, any coupling between the center inductor L2 and its adjacent inductors L1, L3 will remain substantially constant.

In other words, notwithstanding any variations and alignment between electrode patterns 4 and 3, coupling between inductor L1 and L2 will be determined primarily by the proximity of conductor L3 and conductor L2a. Since these two conductors L3, L2a are on the same substrate layer, any variations in alignment between electrode patterns 4 and 3 will have virtually no effect. Similarly, coupling between inductor L2 and inductor L1 will be determined primarily by the proximity of conductor L2b and L1. Accordingly, since these two conductors L2b, L1 are on the same substrate layer, variations in alignment between electrode patterns 4 and 3 will have virtually no effect.

Referring back to FIG. 4E, another feature of this RF module concerns the bypass capacitors C101–C108. These capacitors C101–C108 are implemented as buried capacitors. As discussed above, the bottom capacitor plates C101b, C102b, C103b, C104b, C105b, C106b, C107b, C 108b are formed as part of the electrode patterns on electrode pattern 3. On top of such capacitor plate regions, a dielectric paste 500 is formed, e.g., deposited, preferably with a very high dielectric constant (K), i.e., higher than the dielectric constant of the ceramic tape. Then, on top of this dielectric paste 500, the top capacitor plates C101a, C102a, C103a, C104a, C105a, C106a, C107a, C108a are formed according to well known conventional techniques. (Further discussion of these types of capacitors in general can be found in U.S. Pat. No. 6,252,761, the disclosure of which is incorporated herein by reference.) These top capacitor plates C101a, C102a, C103a, C104a, C105a, C106a, C107a, C108a are then coupled to their respective power supply terminals in electrode pattern 7 by conductive vias 101v, 102v, 103v, 104v, 105v, 106v, 107v, 108v. The lengths of these conductive vias, as well as the lengths of any additional interconnecting lines, are known (based upon the LTCC substrate design parameters); therefore, the inductance of each such conduction path can be determined (e.g., by computation or measurement).

Figure 7:
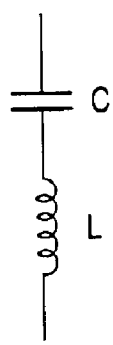
FIG. 7 is a circuit schematic diagram of a series resonant circuit formed by the buried capacitors and associated conductive vias used in the RF module as depicted in FIGS. 4A–4H.

Referring to FIG. 7, the capacitance for each of these capacitors C101, C102, C103, C104, C105, C106, C107, C108 can be selected and designed such that these respective inductances and capacitances, which are in series, will form series resonant circuits at the nominal signal frequency. Hence, in accordance with well known RF principles, such series resonant circuits will provide virtual short circuit connections between the bypass power supply terminals and RF circuit grounds for any signals appearing at such nominal frequency.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a radio frequency (RF) filter within a multilayered low temperature co-fired ceramic (LTCC) substrate, comprising:

a first ceramic tape layer with a first electrode pattern forming a first RF ground plane;

a second ceramic tape layer with a second electrode pattern forming a second RF ground plane;

a third ceramic tape layer positioned between said first and second ceramic tape layers with a third electrode pattern including a first sub-pattern forming a portion of a first shunt reactance including a first inductance, and a second sub-pattern forming a first portion of a second shunt reactance including a first portion of a second inductance;

a fourth ceramic tape layer positioned between said first and second ceramic tape layers with a fourth electrode pattern including a third sub-pattern forming a portion of a third shunt reactance including a third inductance, and a fourth sub-pattern forming a second portion of said second shunt reactance including a second portion of said second inductance; and a plurality of conductive vias coupling selected respective portions of said first, second, third and fourth electrode patterns;

wherein said third and fourth electrode patterns together form at least a portion of a multiple-pole RF bandpass filter circuit with said second shunt reactance coupled intermediately to said first and third shunt reactance portions, and corresponding portions of said first and third sub-patterns are mutually superimposed.

2. The apparatus of claim 1, wherein said second shunt reactance is coupled intermediately to said first and third shunt reactance portions by first and second reactances.

3. The apparatus of claim 2, wherein:

said third electrode pattern further includes fifth and sixth sub-patterns forming respective first portions of said first and second reactances; and said fourth electrode pattern further includes seventh and eighth sub-patterns forming respective second portions of said first and second lumped-circuit reactances.

4. The apparatus of claim 3, wherein said respective first and second portions of said first and second reactances together comprise first and second capacitances.

5. The apparatus of claim 3, wherein:

said fifth and seventh sub-patterns of said third and fourth electrode patterns and a first portion of said fourth ceramic tape layer together form a first capacitance; and said sixth and eighth sub-patterns of said third and fourth electrode patterns and a second portion of said fourth ceramic tape layer together form a second capacitance.

6. The apparatus of claim 3, wherein:

said fifth and sixth sub-patterns of said third electrode pattern comprise first and second capacitor plate electrodes; and said seventh and eighth sub-patterns of said fourth electrode pattern comprise third and fourth capacitor plate electrodes.

7. The apparatus of claim 6, wherein:

each of said first, second, third and fourth capacitor plate electrodes is approximately rectangular with a corresponding major axis;

said first and third capacitor plate electrodes are mutually superimposed and said first and third major axes are approximately orthogonal; and said second and fourth capacitor plate electrodes are mutually superimposed and said second and fourth major axes are approximately orthogonal.

8. The apparatus of claim 1, wherein:

said first shunt reactance comprises said first inductance coupled in parallel with a first shunt capacitance;

said second shunt reactance comprises said second inductance coupled in parallel with a second shunt capacitance; and said third shunt reactance comprises said third inductance coupled in parallel with a third shunt capacitance.

9. The apparatus of claim 8, further comprising first, second and third trimmable capacitances coupled in parallel with said first, second and third shunt capacitances, respectively.

10. An apparatus including a radio frequency (RF) filter within a multilayered low temperature co-fired ceramic (LTCC) substrate, comprising:

a first ceramic tape layer with a first electrode pattern forming a first RF ground plane;

a second ceramic tape layer with a second electrode pattern forming a second RF ground plane;

a third ceramic tape layer positioned between said first and second ceramic tape layers with a third electrode pattern including a first sub-pattern forming a portion of a first shunt reactance including a first inductance, and a second sub-pattern forming a first portion of a second shunt reactance including a first portion of a second inductance;

a fourth ceramic tape layer positioned between said first and second ceramic tape layers with a fourth electrode pattern including a third sub-pattern forming a portion of a third shunt reactance including a third inductance, and a fourth sub-pattern forming a second portion of said second shunt reactance including a second portion of said second inductance; and a plurality of conductive vias coupling selected respective portions of said first, second, third and fourth electrode patterns;

wherein said third and fourth electrode patterns together form at least a portion of a multiple-pole RF bandpass filter circuit with said second shunt reactance coupled intermediately to said first and third shunt reactance portions, and said second and fourth sub-patterns together form an approximately symmetrical portion of a periphery at least partially enclosing said first and third sub-patterns.

11. The apparatus of claim 10, wherein said approximately symmetrical periphery portion comprises an axially symmetrical periphery portion.

12. The apparatus of claim 10, wherein said second shunt semi-lumped-circuit reactance is coupled intermediately to said first and third shunt semi-lumped-circuit reactance portions by first and second serial reactances.

13. The apparatus of claim 12, wherein:

said third electrode pattern further includes fifth and sixth sub-patterns forming respective first portions of said first and second serial reactances; and said fourth electrode pattern further includes seventh and eighth sub-patterns forming respective second portions of said first and second serial reactances.

14. The apparatus of claim 13, wherein said respective first and second portions of said first and second serial reactances together comprise first and second capacitances.

15. The apparatus of claim 13, wherein:

said fifth and seventh sub-patterns of said third and fourth electrode patterns and a first portion of said fourth ceramic tape layer together form a first capacitance; and said sixth and eighth sub-patterns of said third and fourth electrode patterns and a second portion of said fourth ceramic tape layer together form a second capacitance.

16. The apparatus of claim 13, wherein:

said fifth and sixth sub-patterns of said third electrode pattern comprise first and second capacitor plate electrodes; and said seventh and eighth sub-patterns of said fourth electrode pattern comprise third and fourth capacitor plate electrodes.

17. The apparatus of claim 16, wherein:

each of said first, second, third and fourth capacitor plate electrodes is approximately rectangular with a corresponding major axis;

said first and third capacitor plate electrodes are mutually superimposed and said first and third major axes are approximately orthogonal; and said second and fourth capacitor plate electrodes are mutually superimposed and said second and fourth major axes are approximately orthogonal.

18. The apparatus of claim 10, wherein:

said first shunt reactance comprises said first inductance coupled in parallel with a first shunt capacitance;

said second shunt reactance comprises said second inductance coupled in parallel with a second shunt capacitance; and said third shunt reactance comprises said third inductance coupled in parallel with a third shunt capacitance.

19. The apparatus of claim 18, further comprising first, second and third trimmable capacitances coupled in parallel with said first, second and third shunt capacitances, respectively.

* * * * *

UNITED STATES PATENT AND TRADEMARK OFFICE
CERTIFICATE OF CORRECTION

PATENT NO. : 6,872,962 B1
DATED : March 29, 2005
INVENTOR(S) : Christopher Barratt It is certified that error appears in the above-identified patent and that said Letters Patent is hereby corrected as shown below:

Column 6,
Line 48, please delete "F1 .", insert -- F1. --.
Line 49, please delete "(I/0)", insert -- (I/O) --.

Column 7,
Line 40, after "211 of", please delete "the".

Column 8,
Line 24, delete "C 108b", insert -- C108b --.

Signed and Sealed this

Thirty-first Day of May, 2005

JON W. DUDAS
*Director of the United States Patent and Trademark Office*